United States Patent
Codd et al.

(10) Patent No.: US 9,872,379 B2
(45) Date of Patent: Jan. 16, 2018

(54) FLEXIBLE PRINTED CIRCUIT WITH RADIO FREQUENCY CHOKE

(71) Applicant: Microsoft Technology Licensing LLC, Redmond, WA (US)

(72) Inventors: Patrick Codd, Belmont, CA (US); Agustya Mehta, Mountain View, CA (US)

(73) Assignee: Microsoft Technology Licensing LLC, Redmond, WA (US)

( * ) Notice: Subject to any disclaimer, the term of this patent is extended or adjusted under 35 U.S.C. 154(b) by 0 days.

(21) Appl. No.: 15/071,481

(22) Filed: Mar. 16, 2016

(65) Prior Publication Data

US 2017/0273171 A1    Sep. 21, 2017

(51) Int. Cl.
*H04N 5/225* (2006.01)
*H04N 5/357* (2011.01)
(Continued)

(52) U.S. Cl.
CPC ......... *H05K 1/0233* (2013.01); *H04N 5/2253* (2013.01); *H04N 5/2257* (2013.01); *H04N 5/3577* (2013.01); *H05K 1/028* (2013.01)

(58) Field of Classification Search
CPC .. H04N 5/2253; H04N 5/2257; H04N 5/3577; H05K 1/028; H05K 1/0233
See application file for complete search history.

(56) References Cited

U.S. PATENT DOCUMENTS 5,165,055 A    11/1992    Metsler
5,296,651 A    3/1994     Gurrie
(Continued)

FOREIGN PATENT DOCUMENTS

CN    101226820 B    7/2010
CN    203289498 U    11/2013
(Continued)

OTHER PUBLICATIONS

Cracraft, et al., "Flexible PCB Grounding Connections for Hybrid Systems", In Proceedings of IEEE International Symposium on Electromagnetic Compatibility, Aug. 5, 2013, pp. 466-471 (6 pages total).

(Continued)

*Primary Examiner* — Abdelaaziz Tissire
(74) *Attorney, Agent, or Firm* — Mark K. Young; Mayer & Williams PC (57) ABSTRACT

In an electronic device that employs high-speed differential signaling on one or more pairs of conductors in a flexible printed circuit, RF chokes are placed in the differential signal path and mounted directly on the flexible printed circuit which is used to interconnect a peripheral device, such as an image sensor, through a connector to another device component such as a main printed circuit board. The RF chokes are configured to suppress common-mode noise propagating in the differential pairs of conductors. In one illustrative embodiment, the RF chokes are located on the flexible printed circuit adjacent to the peripheral device to suppress common-mode noise near its source. In another illustrative embodiment, the RF chokes are mounted adjacent to the connector to suppress the common-mode noise before it has an opportunity to escape the flexible printed circuit at the major discontinuity presented by the connector.

19 Claims, 11 Drawing Sheets

(51) Int. Cl.
*H05K 1/00* (2006.01)
*H05K 1/02* (2006.01)

(56) References Cited

U.S. PATENT DOCUMENTS

| | | | |
|---|---|---|---|
| 5,917,149 A | 6/1999 | Barcley | |
| 6,160,349 A | 12/2000 | Nagai | |
| 6,255,582 B1 | 7/2001 | Miller et al. | |
| 7,402,884 B2 | 7/2008 | Xie | |
| 7,404,250 B2 | 7/2008 | Cheng et al. | |
| 7,439,449 B1 | 10/2008 | Kumar et al. | |
| 7,629,537 B2 | 12/2009 | Ice | |
| 7,672,142 B2 | 3/2010 | Wang et al. | |
| 7,869,206 B2 | 1/2011 | Dabov et al. | |
| 7,916,089 B2 | 3/2011 | Schlub et al. | |
| 8,058,559 B2 | 11/2011 | Muro et al. | |
| 8,072,304 B2 | 12/2011 | Kato et al. | |
| 8,308,509 B2 | 11/2012 | Karam | |
| 8,432,322 B2 | 4/2013 | Amm et al. | |
| 2002/0015293 A1* | 2/2002 | Akiba | H01L 23/5383 361/793 |
| 2002/0075096 A1* | 6/2002 | Anthony | H01G 4/012 333/167 |
| 2004/0065962 A1* | 4/2004 | Shinomiya | H01L 23/49838 257/776 |
| 2005/0001905 A1* | 1/2005 | Shinomiya | H04N 5/23241 348/207.99 |
| 2005/0116235 A1 | 6/2005 | Schultz et al. | |
| 2006/0067199 A1 | 3/2006 | Tanaka | |
| 2006/0126311 A1* | 6/2006 | Hall | H05K 1/0231 361/749 |
| 2007/0215962 A1* | 9/2007 | Minervini | B81B 7/0064 257/414 |
| 2008/0143871 A1* | 6/2008 | Go | H04N 5/2257 348/374 |
| 2008/0164055 A1 | 7/2008 | Wang | |
| 2009/0058559 A1 | 3/2009 | Pakkala | |
| 2009/0079716 A1* | 3/2009 | Kim | G09G 3/2092 345/204 |
| 2009/0201399 A1* | 8/2009 | Senga | H04N 5/2253 348/294 |
| 2009/0231226 A1 | 9/2009 | Quan et al. | |
| 2009/0294155 A1 | 12/2009 | Suzuki | |
| 2011/0255250 A1 | 10/2011 | Dinh et al. | |
| 2011/0285972 A1* | 11/2011 | Hu | G03B 21/145 353/85 |
| 2014/0092034 A1 | 4/2014 | Franklin et al. | |
| 2014/0111684 A1 | 4/2014 | Corbin et al. | |
| 2014/0140018 A1 | 5/2014 | Malek et al. | |
| 2016/0070296 A1* | 3/2016 | Koo | G06F 1/163 361/679.03 |

FOREIGN PATENT DOCUMENTS

| | | |
|---|---|---|
| KR | 20080028210 A | 3/2008 |
| KR | 20090037654 A | 4/2009 |
| WO | 2006098076 A1 | 9/2006 |
| WO | 2014000828 A1 | 1/2014 |

OTHER PUBLICATIONS

Tan, et al., "A Common-Mode Choke Using Toroid-EQ Mixed Structure", In Proceedings of IEEE Transactions on Power Electronics, vol. 28, Issue 1, Jan. 2013, pp. 31-35. (5 pages total).

"WE-FLAT Ferrite for Flexible Printed Circuit Boards", Retrieved on: Feb. 27, 2015 Available at: http://katalog.we-online.de/en/pbs/WE-FLAT_Flachkern_fuer_flexible_Leiterplatten#vs_t2:2_t1:1 (2 pages total).

"International Search Report and Written Opinion Issued in PCT Application No. PCT/US2017/021461", dated Aug. 28, 2017, 12 Pages.

* cited by examiner

FLEXIBLE PRINTED CIRCUIT WITH RADIO FREQUENCY CHOKE

BACKGROUND

Electro-magnetic interference (EMI) is typically emitted within the radio frequency (RF) spectrum during the operation of electronic devices.

SUMMARY

In an electronic device that employs high-speed differential signaling on one or more pairs of conductors in a flexible printed circuit, RF chokes are placed in the differential signal path and mounted directly on the flexible printed circuit which is used to interconnect a peripheral device, such as an image sensor, through a connector to another device component such as a main printed circuit board. The RF chokes are configured to suppress common-mode noise propagating in the differential pairs of conductors. In one illustrative embodiment, the RF chokes are located on the flexible printed circuit adjacent to the peripheral device to suppress common-mode noise near its source. In another illustrative embodiment, the RF chokes are mounted adjacent to the connector to suppress the common-mode noise before it has an opportunity to escape the flexible printed circuit at the major discontinuity presented by the connector.

Locating the common-mode RF chokes directly on the flexible printed circuit enables implementation of an effective EMI management solution which can be particularly advantageous in wearable computing devices, such as head mounted display (HMD) devices, and in other applications having packaging constraints in which space is limited and weight is sought to be minimized.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

DESCRIPTION OF THE DRAWINGS

Like reference numerals indicate like elements in the drawings. Elements are not drawn to scale unless otherwise indicated.

DETAILED DESCRIPTION

Figure 1:
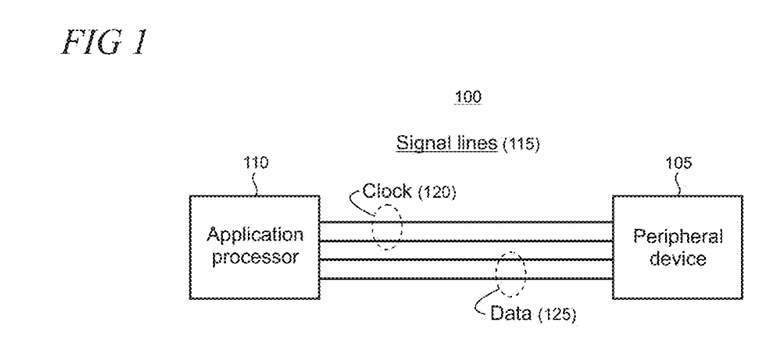
FIG. 1 is a block diagram of an illustrative arrangement of electronic elements including a peripheral device operatively coupled to an application processor over signal lines.

FIG. 1 is a block diagram of an illustrative arrangement 100 of electronic elements in which a peripheral device 105 is operatively coupled to an application processor 110 over signal lines 115. The interfaces between elements may be proprietary in some implementations, or be described by specifications such as those published by the MIPI (Mobile Industry Processor Interface) Alliance, for example. The signal lines comprise conductors or traces that are configured in pairs to support differential signaling in which the peripheral device 105 transmits signals as a differential pair that are driven 180 degrees out of phase. A receiver in the application processor 110 recovers a signal as the voltage difference on the two signal lines. Although requiring two signal lines rather than one, differential signals are more immune to noise than single-ended signals using a single conductor and ground because external noise affects both conductors equally.

In this particular example, a conductor pair is provided for each of a differential clock signal 120 and differential data signal 125 as outputs from the peripheral device 105. However, other numbers and arrangements of conductor pairs may be utilized in other implementations, including both inputs and outputs to or from the peripheral device 105 and application processor 110, and the present flex circuit with RF choke is not limited to any particular number of conductor pairs.

Figure 2:
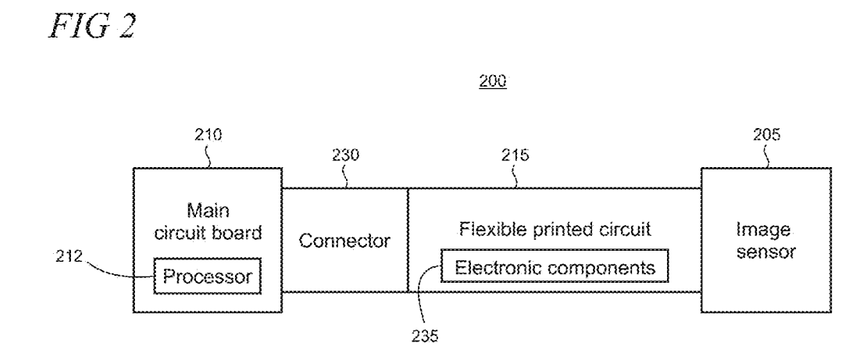
FIG. 2 is a block diagram of an illustrative implementation for an arrangement of electronic elements including an image sensor that is operatively coupled to a main printed circuit board through a flexible printed circuit and connector.
Figure 3:
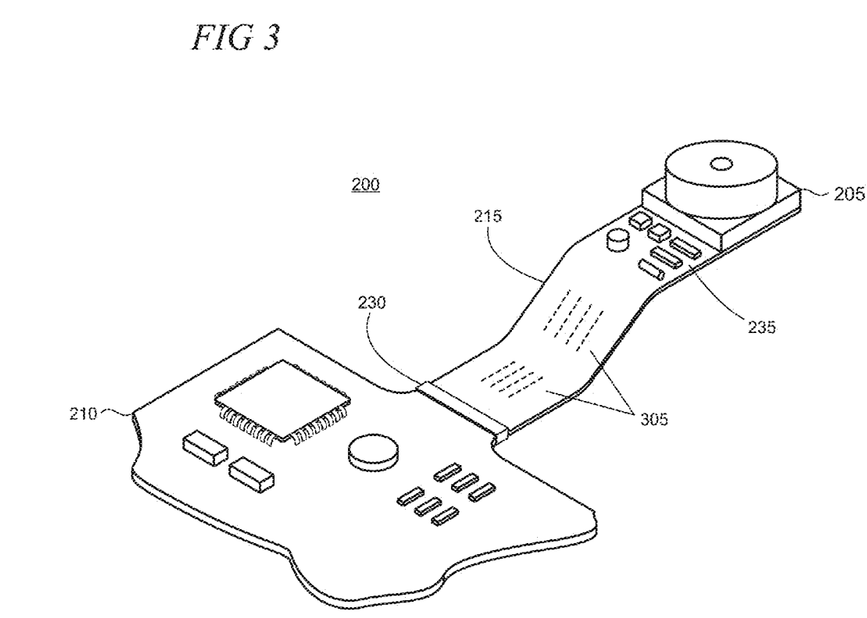
FIG. 3 is a pictorial view of the arrangement of electronic elements shown in FIG. 2.

FIG. 2 is block diagram an illustrative implementation for an arrangement 200 of electronic elements in which a peripheral device is embodied as an image sensor 205 that is operatively coupled to a main circuit board 210 (which typically includes one or more processors 212) by a flexible printed circuit 215 and connector 230. Various electronic components 235 can be populated on the flexible printed circuit in some implementations. FIG. 3 shows a pictorial representation of the arrangement 200 (it is noted that the pictorial representation is not drawn to scale).

The image sensor may be implemented as a CMOS (Complementary Metal Oxide Silicon) or CCD (charge coupled device) camera in some cases. The main printed circuit board 210 supports various components including the application processor that interacts with the image sensor. The main circuit board 210 is a rigid printed circuit board in this particular example, but may also comprise a flexible printed circuit in some implementations.

The flexible printed circuit 215 includes the differential signal lines that support communication between the image sensor and the application processor on the main printed circuit board 210. The flexible printed circuit 215 uses a flexible plastic substrate that enables the circuit to assume two- or three-dimensional configurations, as illustratively shown in FIG. 3, and thus can support device packaging geometries that might not be possible with rigid printed circuit boards. Flexible printed circuits may be utilized, for example, as a component of an electronic device such as the head mounted display (HMD) device and other portable electronic devices as respectively shown in FIGS. 10-12 and described in the accompanying text below.

In some cases, a flexible printed circuit may dynamically flex when device components move relative to each other when the device is in use. Flexible printed circuits have lower mass than their rigid counterparts which can provide increased vibration and shock resistance while providing weight savings which may be an important design goal in some implementations.

In general, flexible printed circuits may be configured with conductors that function as wiring structures to enable interconnection of various electronic assemblies utilized in a given device. Representative conductors are depicted using the dashed lines 305 in FIG. 3. Flexible printed circuits may also be configured to support interconnections and circuits among electronic components (e.g., integrated circuits, resistors, capacitors, inductors, and the like) that are populated on the flexible printed circuit in a similar manner as with rigid printed circuit boards. In some cases, as illustratively shown in FIG. 3, flexible printed circuits may support a combination of wiring structures 305 and component/circuits 235.

Figure 4:
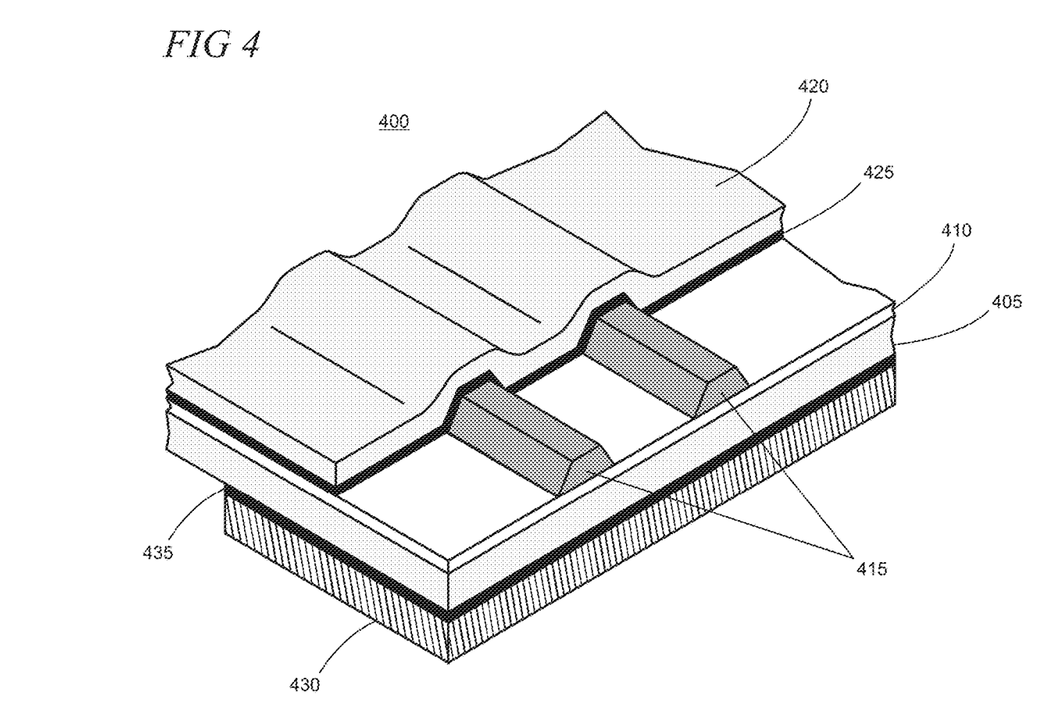
FIG. 4 shows a partial cutaway view of a portion of an illustrative single-layer flexible printed circuit.

FIG. 4 shows a partial cutaway view of a portion of an illustrative flexible printed circuit 400. A flexible polymer dielectric substrate 405 such as a polyimide (PI) or polyester (PE) film uses an acrylic or epoxy adhesive layer 410 to adhere a conductive copper layer that is etched to create conductors 415. A PI coverlay 420 is laminated using a pressure-sensitive or thermosetting adhesive 425 over the etched copper to insulate the conductors and function as a solder resist for the flexible printed circuit. In some applications, the coverlay can be applied to the flexible printed circuit as a coating that does not use lamination or adhesive.

In some applications, a stiffener 430 may be applied to various portions of the flexible printed circuit 400 with a pressure-sensitive or thermosetting adhesive 435. The stiffener can be formed from a glass-reinforced epoxy sheet comprising glass woven fabric impregnated with an epoxy resin binder. The stiffener functions to rigidize a portion of the flexible printed circuit. Such rigidizing may be useful, for example, to support surface mounted electronic components, protect solder joints and other connections, provide reinforcement in high stress areas such as bends, and aid in heat dissipation.

Figure 5:
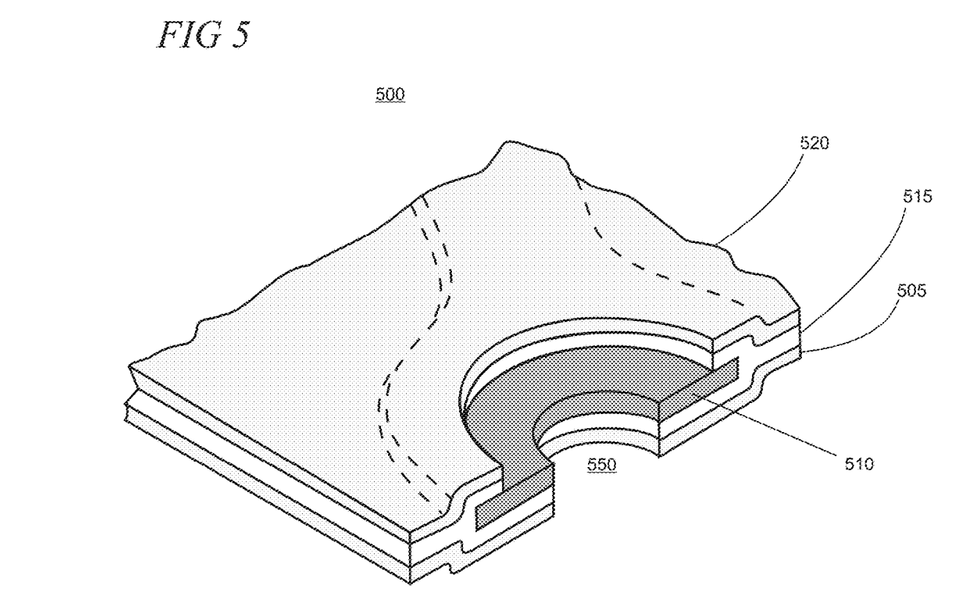
FIG. 5 shows a cross-sectional view of a portion of an illustrative single-layer flexible printed circuit with a through-hole.

Flexible printed circuits may be configured to support either or both surface mount and through-hole/leaded electronic components. For example, as shown in the cross-sectional view of a portion of an illustrative flexible printed circuit 500 in FIG. 5, the conductor 510 includes a drilled hole 550 (in which the hole is typically drilled prior to etching) and the coverlay 520 is configured with a corresponding opening to enable access to the conductor 510. In FIG. 5, the reference numeral 505 indicates the polymer substrate and reference numeral 515 indicates the acrylic adhesive.

Figure 6:
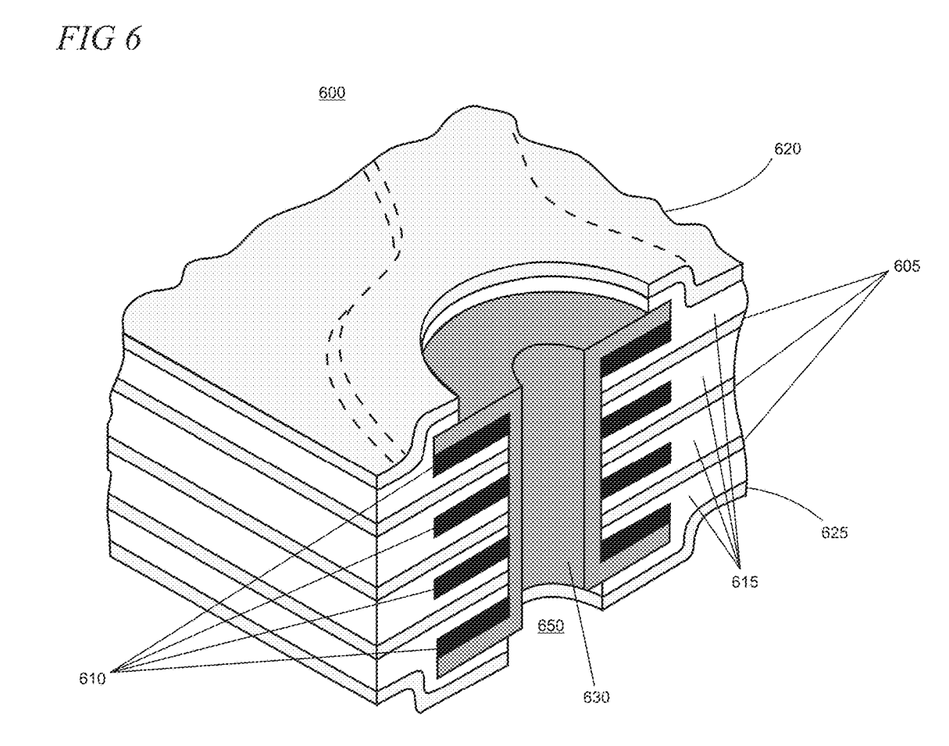
FIG. 6 shows a cross-sectional view of a portion of an illustrative multi-layer flexible printed circuit with a plated through-hole

It is noted that FIGS. 4 and 5 illustrate single-layer flexible printed circuits. However, as with rigid printed circuits, flexible printed circuits may be configured with multiple layers of conductors, i.e., 2, 3, or more separate flexible conductive layers with flexible dielectric layers between each. For example, FIG. 6 shows a cutaway view of a portion of an illustrative flexible printed circuit 600 with four layers of conductors 610 that are separated by flexible dielectric layers 605 (e.g., PI or PE film), and adhesive layers 615. Outer coverlays 620 and 625, having openings, are laminated to the top and bottom of the flexible printed circuit.

In this particular example, the through-hole 650 is copper plated, as indicated by reference numeral 630 to provide an electrical connection between the conductor layers. Non-plated through-holes and/or plated through vias may also be utilized in a given flexible printed circuit. A blind via connects an outer layer with the adjacent inner layer, but does not go all the way through the circuit. Buried vias connect internal layers, but do not connect to the outer layers. Other electrical and structural features (e.g., pins, connectors, bosses, etc.) may also be incorporated into a flexible printed circuit in some cases.

Figure 7:
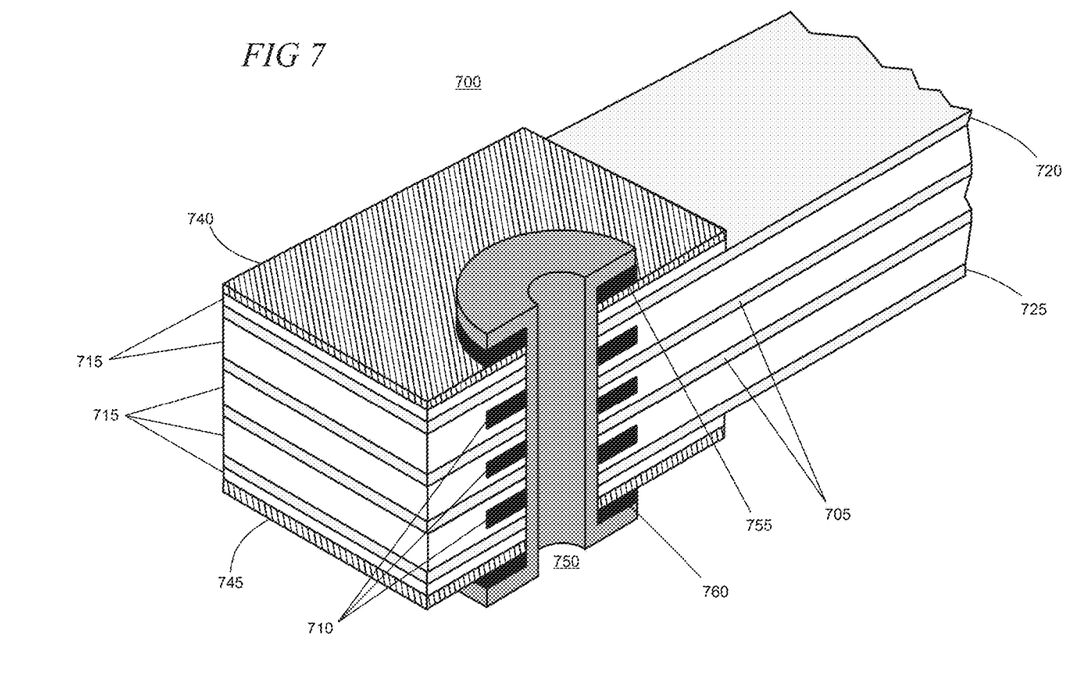
FIG. 7 shows a cross-sectional view of a portion of an illustrative rigid-flex printed circuit.

Hybrid constructions of rigid and flexible printed circuits may also be utilized with the present RF choke. For example, FIG. 7 shows a cutaway view of a portion of an illustrative rigid-flex printed circuit 700. The rigid-flex printed circuit includes multiple layers of flexible conductors, dielectric material, and adhesive (respectively indicated by reference numerals 710, 705, and 715) in a similar manner as the flexible printed circuit 600 (FIG. 6). Coverlays 720 and 725 are also utilized, as shown. In addition, rigid layers 740 and 745 such as glass-reinforced epoxy sheets are attached to the flexible portion of the rigid-flex printed circuit with adhesive. Unlike the stiffener 430 (FIG. 4), the rigid layers support conductors, as respectively indicated by reference numerals 755 and 760. In this particular example, a plated through-hole 750 electrically couples the respective conductor layers together.

Figure 8:
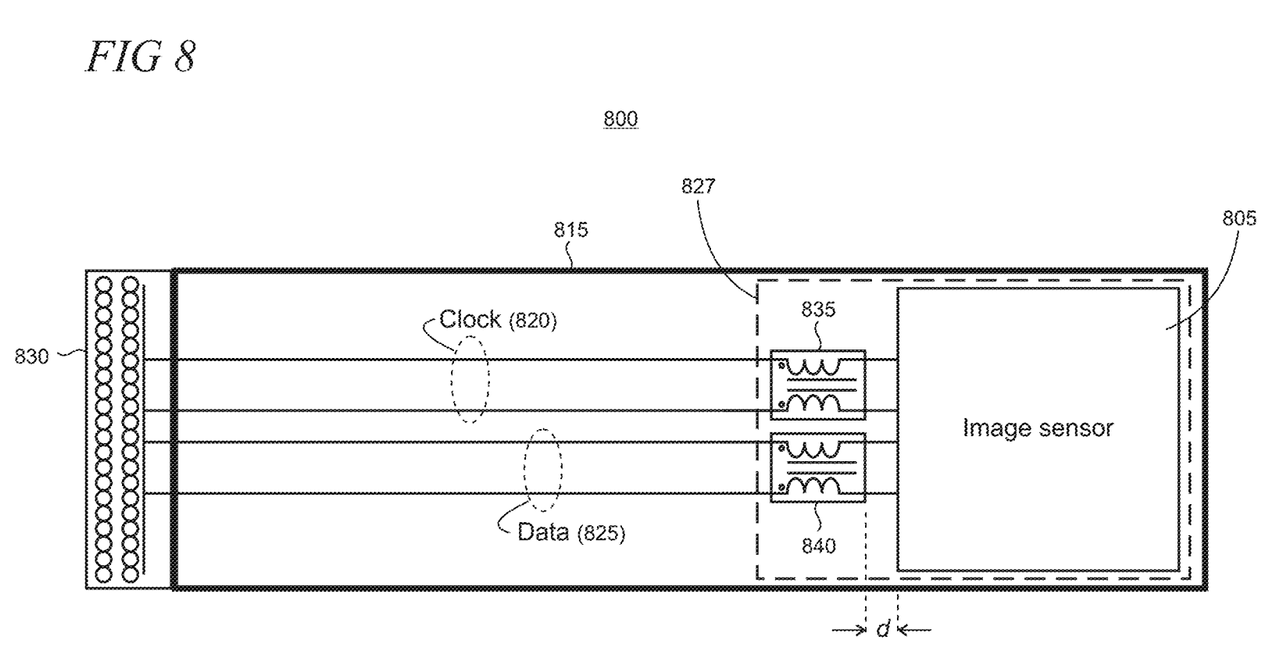
FIG. 8 shows a schematic diagram of a first illustrative embodiment of a circuit in which one or more RF chokes are disposed on a flexible printed circuit.

FIG. 8 shows a schematic diagram of a first illustrative embodiment of a circuit 800 in which one or more RF chokes are disposed on a flexible printed circuit 815 which may be used as an assembly in an electronic device. In this embodiment, differential pairs of signal lines are utilized respectively for a differential clock signal 820 and differential data signal 825 that are output from an image sensor 805. The flexible printed circuit 815 may be configured with a flat (i.e., substantially planar) portion 827 and may include a stiffener (e.g., element 430 in FIG. 4), and/or be configured as a rigid-flex printed circuit in some cases to facilitate surface mounting of the image sensor. The flexible printed circuit 815 may support other lines, circuits, and components (not shown) in some implementations.

The differential pairs of signal lines are terminated at a connector 830 that is configured to interface with another component or assembly, such as a main printed circuit board, in an electronic device. The connector can be implemented using a variety of different types and configurations and may utilize corresponding mating parts (e.g., pin and sockets) in which one part of the connector is crimped or soldered to the flexible printed circuit and another connector part is mounted on the other component (e.g., the main printed circuit board). Alternatively, a portion of the flexible printed circuit can be configured to interface with a connector that is mounted on the other component. Illustrative examples of these alternative connector types include low insertion force (LIF) and zero insertion force (ZIF) connectors that capture mating contacts on one or more tabs, fingers, tails, or other suitable features of the flexible printed circuit.

An RF choke is utilized in the signal path for each differential pair of signal lines, as respectively indicated by reference numerals 835 and 840. The RF chokes may be implemented using common-mode coil-based designs in which two coils are wound on a single core, or silicon-based designs may be utilized in some cases. As signals flow in opposite directions on the differential pair through each of the RF choke windings, equal and opposite magnetic fields are generated which cancel each other out which results in the RF choke presenting low impedance to the differential signals which can pass through the RF choke without significant attenuation. By contrast, as the common-mode noise signals travel in the same direction through each of the choke windings, equal and in-phase magnetic fields are generated which add together. The RF choke thus presents high impedance to the common-mode noise signal which passes through the RF choke with heavy attenuation. As a result, common-mode noise is significantly suppressed.

The RF chokes 835 and 840 are located in the flat portion 827 adjacent to the image sensor 805 in this embodiment in order to implement common-mode rejection close to the noise source to minimize the escape of EMI energy. That is, the distance d between the RF chokes and image sensor is typically sought to be minimized so that the noise can be suppressed before it can escape the flexible printed circuit and then possibly be re-radiated as EMI in the electronic device.

Figure 9:
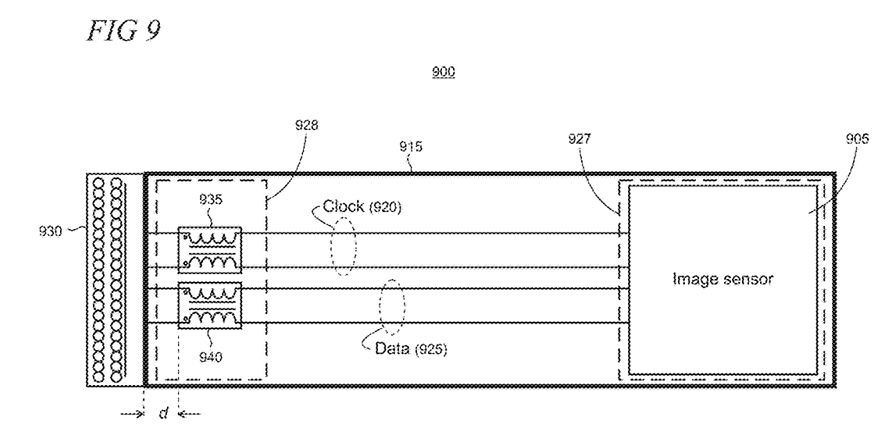
FIG. 9 shows a schematic diagram of a second illustrative embodiment of a circuit in which one or more RF chokes are disposed on a flexible printed circuit.

FIG. 9 shows a schematic diagram of a second illustrative embodiment of a circuit 900 in which one or more RF chokes are disposed on a flexible printed circuit 915 which may be used as an assembly in an electronic device. As in the previous embodiment, differential pairs of signal lines are utilized respectively for a differential clock signal 920 and differential data signal 925 that are output from an image sensor 905. The flexible printed circuit 915 may include a flat (i.e., substantially planar) portion 927 as well as a stiffener (e.g., element 430 in FIG. 4) and/or be configured as a rigid-flex printed circuit in some cases to facilitate surface mounting of the image sensor. The flexible printed circuit 915 may support other lines, circuits, and components (not shown) in some implementations.

In this embodiment, the RF chokes 935 and 940 are located in a flat portion 928 adjacent to the connector 930 in order to suppress the common-mode noise before it can escape the flexible printed circuit at the discontinuity presented by the connector and then possibly be re-radiated as EMI in the electronic device. Accordingly, the distance d between the RF chokes and connector is typically sought to be minimized. The flexible printed circuit 915 may include a stiffener (e.g., element 430 in FIG. 4) and/or be configured as a rigid-flex printed circuit in some cases to facilitate surface mounting of the RF chokes 935 and 940.

The present flexible printed circuit with RF choke may be incorporated into one or more systems that are utilized in a virtual or mixed reality display device. Such device may take any suitable form, including but not limited to near-eye devices such as an HMD device. A see-through display may be used in some implementations while an opaque (i.e., non-see-through) display using a camera-based passthrough or outward facing sensor, for example, may be used in other implementations.

Figure 10:
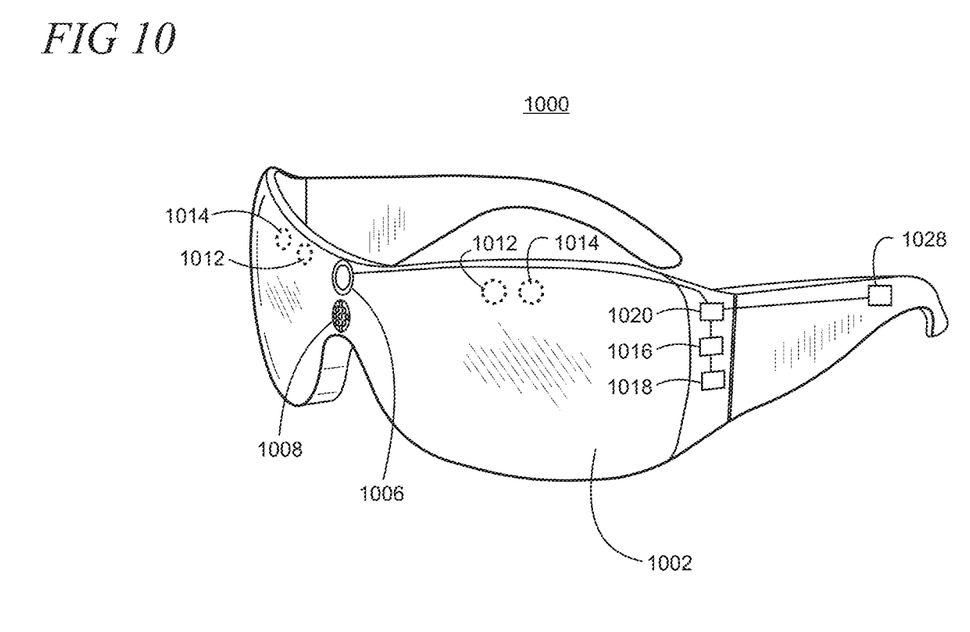
FIG. 10 is a pictorial view of an illustrative example of a virtual reality or augmented reality head mounted display (HMD) device.
Figure 11:
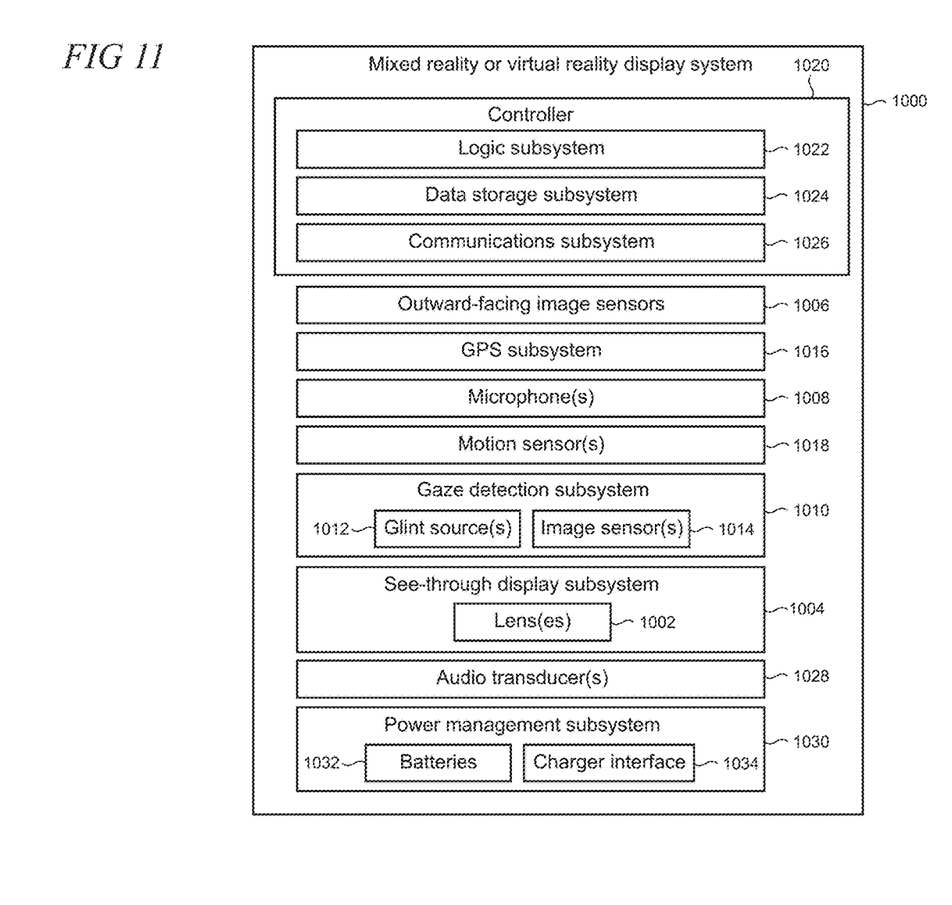
FIG. 11 shows a block diagram of an illustrative example of a virtual reality or augmented reality HMD device.

FIG. 10 shows one particular illustrative example of a see-through, augmented reality or virtual reality display system 1000, and FIG. 11 shows a functional block diagram of the system 1000. Display system 1000 comprises one or more lenses 1002 that form a part of a see-through display subsystem 1004, such that images may be displayed using lenses 1002 (e.g. using projection onto lenses 1002, one or more waveguide systems incorporated into the lenses 1002, and/or in any other suitable manner). Display system 1000 further comprises one or more outward-facing image sensors 1006 configured to acquire images of a background scene and/or physical environment being viewed by a user, and may include one or more microphones 1008 configured to detect sounds, such as voice commands from a user. Outward-facing image sensors 1006 may include one or more depth sensors and/or one or more two-dimensional image sensors. In alternative arrangements, as noted above, an augmented reality or virtual reality display system, instead of incorporating a see-through display subsystem, may display augmented reality or virtual reality images through a viewfinder mode for an outward-facing image sensor.

The display system 1000 may further include a gaze detection subsystem 1010 configured for detecting a direction of gaze of each eye of a user or a direction or location of focus, as described above. Gaze detection subsystem 1010 may be configured to determine gaze directions of each of a user's eyes in any suitable manner. For example, in the illustrative example shown, a gaze detection subsystem 1010 includes one or more glint sources 1012, such as infrared light sources, that are configured to cause a glint of light to reflect from each eyeball of a user, and one or more image sensors 1014, such as inward-facing sensors, that are configured to capture an image of each eyeball of the user. Changes in the glints from the user's eyeballs and/or a location of a user's pupil, as determined from image data gathered using the image sensor(s) 1014, may be used to determine a direction of gaze.

In addition, a location at which gaze lines projected from the user's eyes intersect the external display may be used to determine an object at which the user is gazing (e.g. a displayed virtual object and/or real background object). Gaze detection subsystem 1010 may have any suitable number and arrangement of light sources and image sensors. In some implementations, the gaze detection subsystem 1010 may be omitted.

The display system 1000 may also include additional sensors. For example, display system 1000 may comprise a global positioning system (GPS) subsystem 1016 to allow a location of the display system 1000 to be determined. This may help to identify real-world objects, such as buildings, etc. that may be located in the user's adjoining physical environment.

The display system 1000 may further include one or more motion sensors 1018 (e.g., inertial, multi-axis gyroscopic, or acceleration sensors) to detect movement and position/orientation/pose of a user's head when the user is wearing the system as part of an augmented reality or virtual reality HMD device. Motion data may be used, potentially along with eye-tracking glint data and outward-facing image data, for gaze detection, as well as for image stabilization to help correct for blur in images from the outward-facing image sensor(s) 1006. The use of motion data may allow changes in gaze location to be tracked even if image data from outward-facing image sensor(s) 1006 cannot be resolved.

In addition, motion sensors 1018, as well as microphone(s) 1008 and gaze detection subsystem 1010, also may be employed as user input devices, such that a user may interact with the display system 1000 via gestures of the eye, neck and/or head, as well as via verbal commands in some cases. It may be understood that sensors illustrated in FIGS. 10 and 11 and described in the accompanying text are included for the purpose of example and are not intended to be limiting in any manner, as any other suitable sensors and/or combination of sensors may be utilized to meet the needs of a particular implementation. For example, biometric sensors (e.g., for detecting heart and respiration rates, blood pressure, brain activity, body temperature, etc.) or environmental sensors (e.g., for detecting temperature, humidity, elevation, UV (ultraviolet) light levels, etc.) may be utilized in some implementations.

The display system 1000 can further include a controller 1020, implemented at least in part using one or more processors, and having a logic subsystem 1022 and a data storage subsystem 1024 in communication with the sensors, gaze detection subsystem 1010, display subsystem 1004, and/or other components through a communications subsystem 1026. The communications subsystem 1026 can also facilitate the display system being operated in conjunction with remotely located resources, such as processing, storage, power, data, and services. That is, in some implementations, an HMD device can be operated as part of a system that can distribute resources and capabilities among different components and subsystems.

The storage subsystem 1024 may include instructions stored thereon that are executable by logic subsystem 1022, for example, to receive and interpret inputs from the sensors, to identify location and movements of a user, to identify real objects using surface reconstruction and other techniques, and dim/fade the display based on distance to objects so as to enable the objects to be seen by the user, among other tasks.

The display system 1000 is configured with one or more audio transducers 1028 (e.g., speakers, earphones, etc.) so that audio can be utilized as part of an augmented reality or virtual reality experience. A power management subsystem 1030 may include one or more batteries 1032 and/or protection circuit modules (PCMs) and an associated charger interface 1034 and/or remote power interface for supplying power to components in the display system 1000.

It may be appreciated that the display system 1000 is described for the purpose of example, and thus is not meant to be limiting. It may be further understood that the display device may include additional and/or alternative sensors, cameras, microphones, input devices, output devices, etc. than those shown without departing from the scope of the present arrangement. Additionally, the physical configuration of a display device and its various sensors and subcomponents may take a variety of different forms without departing from the scope of the present arrangement.

Figure 12:
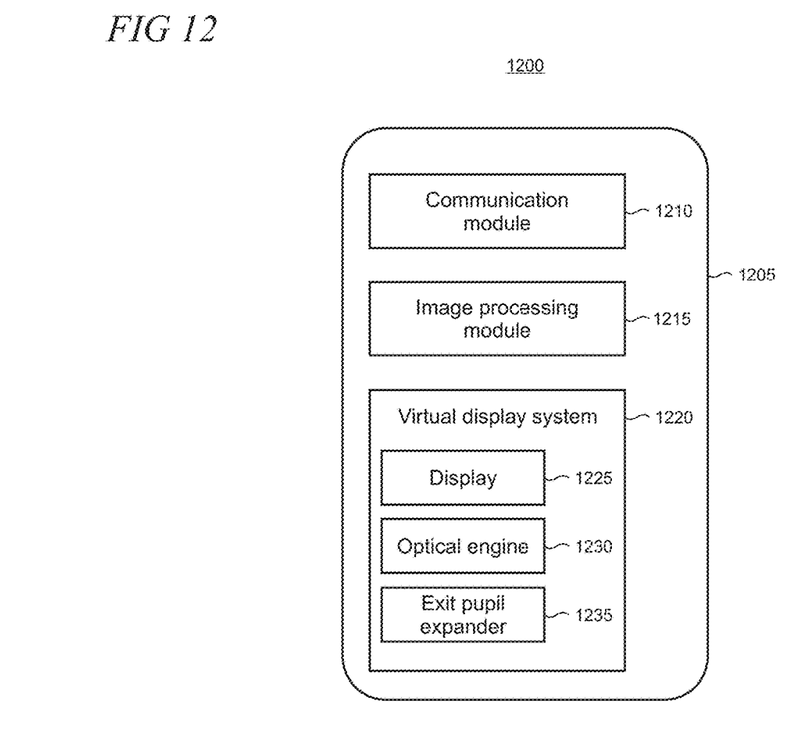
FIG. 12 shows a block diagram of an illustrative electronic device that incorporates an augmented reality or virtual reality display system.

As shown in FIG. 12, an augmented reality or virtual reality display system using the present flexible printed circuit with RF choke can be used in a mobile or portable electronic device 1200, such as a mobile phone, smartphone, personal digital assistant (PDA), communicator, portable Internet appliance, hand-held computer, digital video or still camera, wearable computer, computer game device, specialized bring-to-the-eye product for viewing, or other portable electronic device. As shown, the portable device 1200 includes a housing 1205 to house a communication module 1210 for receiving and transmitting information from and to an external device, or a remote system or service (not shown).

The portable device 1200 may also include an image processing module 1215, implemented using one or more processors, for handling the received and transmitted information, and a virtual display system 1220 to support viewing of images. The virtual display system 1220 can include a micro-display or an imager 1225 and an optical engine 1230. The image processing module 1215 may be operatively connected to the optical engine 1230 to provide image data, such as video data, to the imager 1225 to display an image thereon. An exit pupil expander (EPE) 1235 can be optically linked to an optical engine 1230. The EPE may incorporate or be part of a display system that support augmented reality or virtual reality images.

The present flexible printed circuit with RF choke may also be utilized in an augmented reality or virtual reality display system utilized in non-portable devices, such as gaming devices, multimedia consoles, personal computers, vending machines, smart appliances, Internet-connected devices, and home appliances, such as an oven, microwave oven and other appliances, and other non-portable devices.

Various exemplary embodiments of the present flexible printed circuit with RF choke are now presented by way of illustration and not as an exhaustive list of all embodiments. An example includes a flexible printed circuit assembly for use in an electronic device, comprising: a flexible printed circuit comprising conductors disposed on a flexible substrate; a set of conductors configured to route a signal as a differential pair from a peripheral device utilized in the electronic device as an input to the flexible circuit; a connector coupled to the set of conductors configured to route the signal as an output from the flexible circuit; and a choke mounted on the flexible printed circuit and electrically connected to the set of conductors in a configuration to attenuate common-mode noise in the flexible printed circuit.

In another example, the connector is configured for connection to an electronic component that supports an application processor. In another example, the signal comprises a high-speed differential signal. In another example, the choke is a common-mode choke comprising first and second windings around a common core. In another example, the choke is a common-mode choke implemented in silicon. In another example, the flexible printed circuit includes one or more planar portions. In another example, the flexible printed circuit includes a stiffener configured to stiffen the planar portion of the flexible printed circuit and the choke is mounted on the stiffened planar portion. In another example, the connector comprises one of a tab, finger, or tail portion of the flexible printed circuit that is configured for mateable insertion with a corresponding connector disposed on a component of the electronic device. In another example, the component includes one of a rigid printed circuit board or a second flexible printed circuit.

A further example includes an electronic device, comprising: at least one processor; a main circuit board on which the at least one processor is mounted; a flexible printed circuit comprising conductors disposed on a flexible substrate; an image sensor coupled to the flexible printed circuit and configured to generate a differential signal that is transmitted over a pair of conductors in the flexible printed circuit; a connector configured to electrically interconnect the flexible printed circuit with the main circuit board so that the image sensor is operatively coupled to the at least one processor; and a common-mode choke mounted on the flexible printed circuit and comprising first and second signal windings around a common core that are respectively coupled in series with the pair of conductors to attenuate common-mode noise in the differential signal.

In another example, the common-mode choke is mounted adjacent to the connector so as to reduce electro-magnetic interference from escaping the flexible printed circuit at a discontinuity presented by the connector. In another example, the common-mode choke is mounted adjacent to the image sensor so as to attenuate common-mode noise near an active noise source. In another example, the image sensor is configured to generate multiple differential signals each of the differential signals being transmitted over different respective pairs of conductors in the flexible printed circuit. In another example, a first differential signal is a clock signal and a second differential signal is a data signal. In another example, the electronic device is embodied in a head mounted display device.

A further example includes an image sensor assembly, comprising: a flexible printed circuit including etched conductors disposed on one or more flexible substrate layers and including at least one planar portion; an image sensor mounted on the flexible printed circuit that is configured to generate differential clock and data signals that are transmitted on different respective pairs of conductors; a connector portion of the flexible printed circuit that is configured to enable the pairs of conductors to be connected to an external system; a first radio frequency common-mode choke connected in series with the differential pair of clock signal conductors; and a second radio frequency common-mode choke connected in series with the differential pair of data signal conductors, wherein the first and second radio frequency common-mode chokes are mounted on the planar portion of the flexible printed circuit proximate to the connector portion.

In another example, the planar portion is rigidized using one of stiffener or hybrid rigid-flex printed circuit. In another example, the first and second radio frequency common-mode chokes are configured to attenuate common-mode noise in the respective clock and data signals. In another example, the image sensor and external system communicate according to the MIPI (Mobile Industry Processor Interface) specification. In another example, the image sensor assembly is utilized as an inward sensor or an outward sensor in a head mounted display device or wearable computing device.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed:

1. A flexible printed circuit assembly for use in an electronic device, comprising:
   a flexible printed circuit comprising conductors disposed on a flexible substrate and including at least one planar portion;
   a set of conductors configured to route a signal as a differential pair from a peripheral device utilized in the electronic device as an input to the flexible printed circuit;
   a connector coupled to the set of conductors configured to route the signal as an output from the flexible printed circuit;
   a first radio frequency common-mode choke connected in series with the differential pair of clock signal conductors; and
   a second radio frequency common-mode choke connected in series with the differential pair of data signal conductors,
   wherein the first and second radio frequency common-mode chokes are mounted on the planar portion of the flexible printed circuit proximate to the connector.

2. The flexible printed circuit assembly of claim 1 in which the connector is configured for connection to an electronic component that supports an application processor.

3. The flexible printed circuit assembly of claim 1 in which the signal comprises a high-speed differential signal.

4. The flexible printed circuit assembly of claim 1 in which at least one of the chokes is a common-mode choke comprising first and second windings around a common core.

5. The flexible printed circuit assembly of claim 1 in which at least one of the chokes is a common-mode choke implemented in silicon.

6. The flexible printed circuit assembly of claim 1 in which the flexible printed circuit includes a stiffener configured to stiffen the planar portion of the flexible printed circuit and at least one of the chokes is mounted on the stiffened planar portion.

7. The flexible printed circuit assembly of claim 1 in which the connector comprises one of a tab, finger, or tail portion of the flexible printed circuit that is configured for mateable insertion with a corresponding connector disposed on a component of the electronic device.

8. The flexible printed circuit assembly of claim 7 in which the component includes one of a rigid printed circuit board or a second flexible printed circuit.

9. An electronic device, comprising:
   at least one processor;
   a main circuit board on which the at least one processor is mounted;
   a flexible printed circuit comprising conductors disposed on a flexible substrate and including at least one planar portion;
   an image sensor coupled to the flexible printed circuit and configured to generate a differential signal that is transmitted over a pair of conductors in the flexible printed circuit;
   a connector configured to electrically interconnect the flexible printed circuit with the main circuit board so that the image sensor is operatively coupled to the at least one processor;
   a first radio frequency common-mode choke connected in series with the differential pair of clock signal conductors; and
   a second radio frequency common-mode choke connected in series with the differential pair of data signal conductors,
   wherein the first and second radio frequency common-mode chokes are mounted on the planar portion of the flexible printed circuit proximate to the connector.

10. The electronic device of claim 9 in which at least one of the common-mode chokes is mounted adjacent to the connector so as to reduce electro-magnetic interference from escaping the flexible printed circuit at a discontinuity presented by the connector.

11. The electronic device of claim 9 in which at least one of the common-mode chokes is mounted adjacent to the image sensor so as to attenuate common-mode noise near an active noise source.

12. The electronic device of claim 9 in which the image sensor is configured to generate multiple differential signals each of the differential signals being transmitted over different respective pairs of conductors in the flexible printed circuit.

13. The electronic device of claim 12 in which a first differential signal is a clock signal and a second differential signal is a data signal.

14. The electronic device of claim 9 as embodied in a head mounted display device.

15. An image sensor assembly, comprising:
- a flexible printed circuit including etched conductors disposed on one or more flexible substrate layers and including at least one planar portion;
- an image sensor mounted on the flexible printed circuit that is configured to generate differential clock and data signals that are transmitted on different respective pairs of conductors;
- a connector portion of the flexible printed circuit that is configured to enable the pairs of conductors to be connected to an external system;
- a first radio frequency common-mode choke connected in series with the differential pair of clock signal conductors; and
- a second radio frequency common-mode choke connected in series with the differential pair of data signal conductors,
- wherein the first and second radio frequency common-mode chokes are mounted on the planar portion of the flexible printed circuit proximate to the connector portion.

16. The image sensor assembly of claim 15 in which the planar portion is rigidized using one of stiffener or hybrid rigid-flex printed circuit.

17. The image sensor assembly of claim 15 in which the first and second radio frequency common-mode chokes are configured to attenuate common-mode noise in the respective clock and data signals.

18. The image sensor assembly of claim 15 in which the image sensor and external system communicate according to the MIPI (Mobile Industry Processor Interface) specification.

19. The image sensor assembly of claim 15 in which the image sensor assembly is utilized as an inward sensor or an outward sensor in a head mounted display device or wearable computing device.

\* \* \* \* \*